United States Patent [19]

Rittenbach

[11] 3,997,913
[45] Dec. 14, 1976

[54] ELECTRONIC TIME COMPRESSOR/EXPANDER UTILIZING MAGNETIC STORAGE
[75] Inventor: Otto E. Rittenbach, Neptune, N.J.
[73] Assignee: The United States of America as represented by the Secretary of the Army, Washington, D.C.
[22] Filed: Jan. 9, 1975
[21] Appl. No.: 539,884
[52] U.S. Cl. .............................. 360/8; 179/15.55 R
[51] Int. Cl.² .................... G11B 5/02; G11B 27/10
[58] Field of Search ............... 179/15.55 R, 15 AV; 360/8, 61, 62, 63, 64, 54

[56] References Cited
UNITED STATES PATENTS

| | | | |
|---|---|---|---|
| 2,903,521 | 9/1959 | Ellison | 360/8 |
| 3,315,242 | 4/1967 | Haddad | 360/8 |
| 3,334,193 | 8/1967 | Dow | 360/8 |
| 3,409,744 | 11/1968 | Liberman | 360/8 |
| 3,621,150 | 11/1971 | Pappas | 360/8 |

*Primary Examiner*—Vincent P. Canney
*Attorney, Agent, or Firm*—Nathan Edelberg; Robert P. Gibson; Michael Zelenka

[57] ABSTRACT

Electronic signals are compressed or expanded by writing periodic samples of the signal onto one side of a thin magnetic disc at a first rate and then reading the samples off the other side of the disc at a second, and different, rate. In another embodiment of the invention, the samples are written onto a rotating magnetic ring or disc by a plurality of write/erase heads which are selectively gated to the signal source. The samples are then read off the disc by a plurality of read-heads which are selectively gated to the external load.

11 Claims, 8 Drawing Figures

ELECTRONIC TIME COMPRESSOR/EXPANDER UTILIZING MAGNETIC STORAGE

GOVERNMENT LICENSE

The invention described herein may be manufactured and used by or for the Government for governmental purposes without the payment of any royalties thereon or therefor.

BACKGROUND OF THE INVENTION a. Field of the Invention

Broadly speaking, this invention relates to the compression or expansion of electrical signals. More particularly, in a preferred embodiment, this invention relates to methods and apparatus for compressing or expanding electrical signals by the use of magnetic storage devices.

b. Summary of the Prior Art

My co-pending application, Ser. No. 367,618, filed June 6, 1973, now U.S. Pat. No. 3,860,760, discloses several electronic techniques for automatically translating electrical signals from a first frequency band to a second frequency band using the principles of either time expansion or compression.

As stated in that application, which is hereby incorporated by reference, electronic time compression or expansion is useful in the processing and analyzing of electronic signals in the fields of radar, sonar, seismology, biomedicine, surgery, machine design, etc. Of course, there are advantages in such all-electronic systems but such systems are expensive to manufacture and difficult to maintain particularly if highly-skilled maintenance personnel are not available in the field.

For that reason, some effort has been expended to achieve similar time compression or expansion using rotating magnetic discs or endless magnetic tapes which, although they require moving parts, are considerably less complex from an electronic standpoint. For example, U.S. Pat. No. 3,621,150 which issued Nov. 16, 1971 to G. W. Poppas, discloses a technique for improving the intelligibility of the speech of a diver who is breathing a helium-oxygen atmosphere. More particularly, FIG. 3 of that patent discloses an apparatus wherein the diver's speech is recorded on an endless magnetic tape at a first speed and played back by a rotating magnetic head which is travelling with the tape but at a slower relative speed, thus shifting the speech signal to a lower, and hence more intelligible frequency band. The technique proposed by Poppas, however, is not suitable for digitilized or sampled signals nor is it suitable for the low frequency signals generated, for example, in moving target indicator (MTI) doppler radar systems.

SUMMARY OF THE INVENTION

The problem then is to provide methods and apparatus for compressing or expanding electronic signals magnetically, which methods and apparatus do not suffer from the defects of the prior art.

This problem has been solved by the instant invention which, in one illustrative embodiment, comprises a disc of magnetic material which is sufficiently thin that localized changes in the magnetic state of the disc which are induced in one face are detectable on the other face. The apparatus also includes at least one magnetic write-head which is positioned proximate one face of the disc to induce local magnetic changes in the disc and at least one magnetic read-head positioned proximate the other face of the disc to detect the localized changes induced by the at least one write-head on the other face of the disc.

The apparatus further includes means for moving the at least one write-head relative to one face of the disc at a first velocity and means for similarly moving the at least one read-head relative to the other face at a second velocity.

Finally, the apparatus includes means for supplying the signal to be expanded or compressed to the at least one write-head and means for connecting the output of the at least one read-head to an external load.

Several other embodiments are disclosed which result in higher compression/expansion ratios, lower rotational speeds for the heads or magnetic media, and greater efficiency.

The invention and its mode of operation will be more fully understood from the following detailed description when taken with the appended drawings, in which:

DETAILED DESCRIPTION OF THE INVENTION

My co-pending application, Ser. No. 367,618, filed June 6, 1973, now U.S. Pat. No. 3,860,760, which application is hereby incorporated by reference, discloses several electronic techniques for automatically translating electrical signals from a first frequency band to a second frequency band using the principles of either time compression or expansion. More particularly, FIG. 8 of my patent discloses an apparatus wherein samples of an analog input signal are written into a multi-stage analog memory at a first clock rate and subsequently read-out from the memory at a second clock rate. The compression ratio of the device is the ratio of the two clock rates and for time compression the read-out rate is higher than the write-in rate. Thus, while the analog memory is being read-out at the faster rate, the oldest samples stored in the analog memory are continuously refreshed with new samples which are inputted at the slower clock rate. For time expansion the read-out clock runs at a slower rate than the write-in clock and, as is generally true for time expansion techniques, some of the incoming analog samples are never read-out from the memory and are lost.

Figure 1:
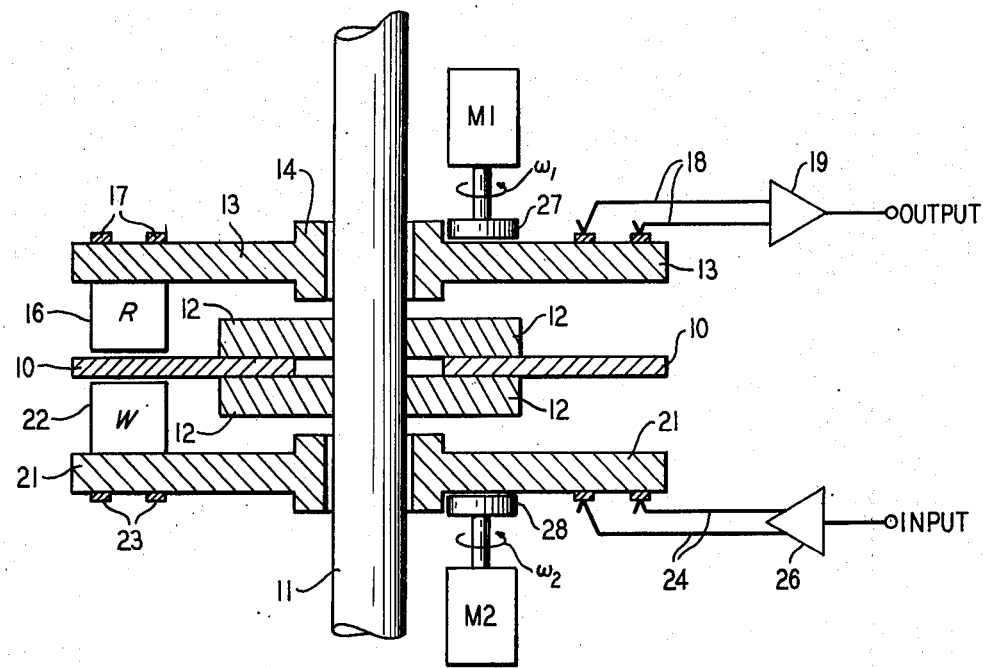
FIG. 1 is a cross-sectional view of an illustrative magnetic storage disc compressor/expander according to the invention.
Figure 8:
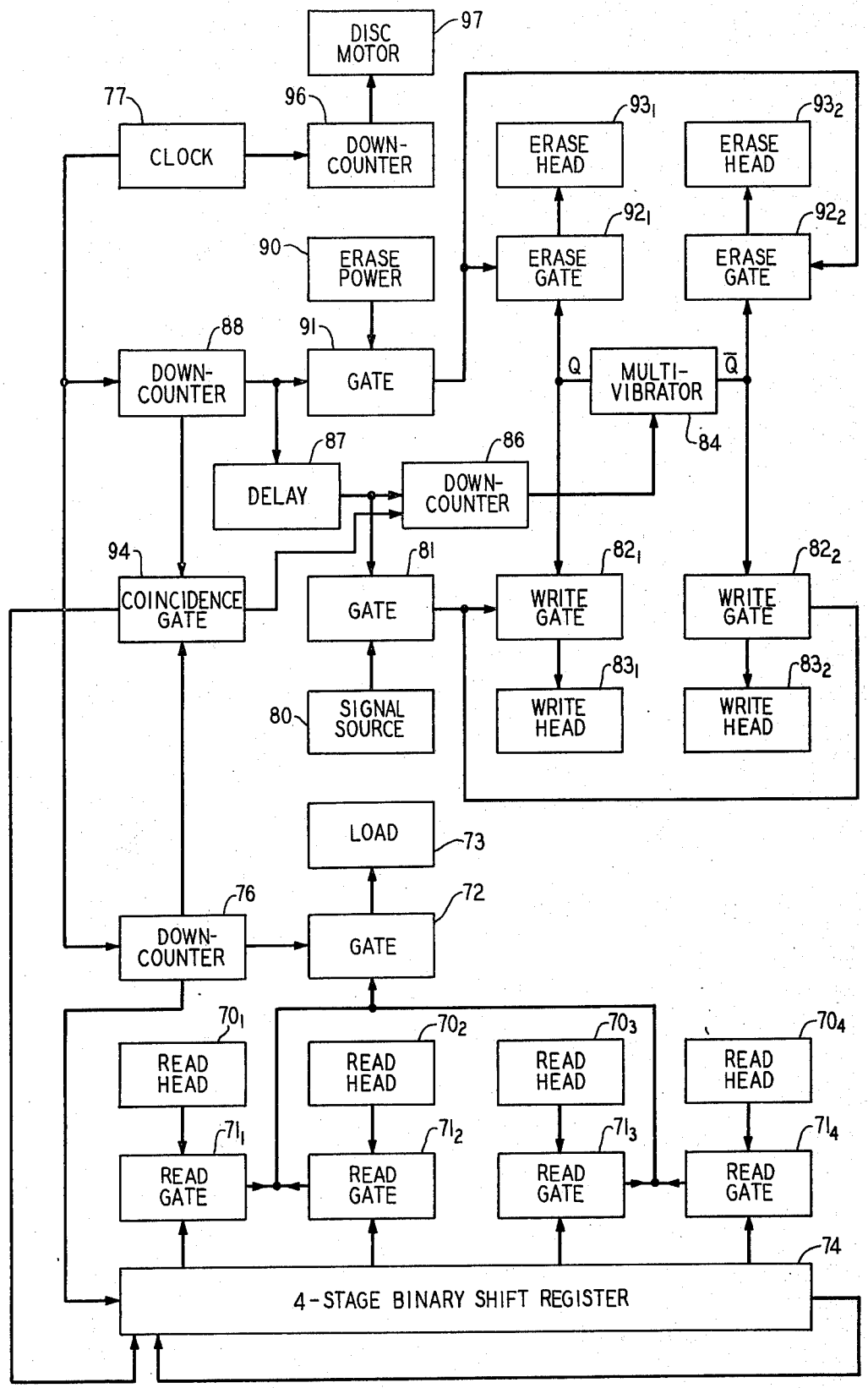
FIG. 8 is a block schematic diagram of the circuitry required to operate the apparatus shown in FIG. 7.

The apparatus shown in FIG. 8 of my above-referenced patent requires a multi-stage analog memory and a large number of write-in and read-out sampling gates. Accordingly, it may be too complex and too expensive for certain signal processing applications. FIG. 1 of the instant patent application discloses, therefore, an electro-mechanical equivalent of the time compressor or expander shown in FIG. 8 of U.S. Pat. No. 3,860,760 and does not suffer from the above-discussed disadvantages.

As shown in FIG. 1, the analog memory of the referenced patent is replaced by a thin, annular disc of magnetic material 10. Disc 10 is rigidly secured to a cylindrical shaft 11 by means of a pair of clamps 12—12. A first support disc 13 is rotatably mounted about shaft 11 by means of a collar 14. Disc 13 supports a dependant magnetic read-head 16 which is electrically connected to a pair of slip-rings 17—17 mounted to the upper surface of disc 13. A pair of contacts 18—18 engage the slip-rings 17—17 and are connected to a read-amplifier 19. In like fashion, a second rotatable support disc 21 supports a magnetic write-head 22 which is connected, via slip-rings 23—23 and contacts 24—24, to a write-amplifier 26.

Disc 13 and read-head 16 are rotated about magnetic disc 10 and shaft 11 by a first motor M1 which has a frictional driver wheel 27 mounted to the shaft of the motor and which engages the collar 14 of disc 13. In like fashion, a second motor M2 and a drive wheel 28 rotate disc 21 and write-head 22 about shaft 11.

Magnetic disc 10 is sufficiently thin that any analog pulse recorded thereon by write-head 22 may be read, through the disc, by read-head 16. Thus, motor M1 may be geared to drive the read-head at a faster, or slower, rate than the write-head, without any mechanical interference between the two heads.

It should be apparent that for time compression W1, the angular rotation of the read-head, must be greater than W2, the angular rotation of the write-head. For time expansion, on the other hand, W2 must be greater than W1.

The magnetic disc 10 could be considered as the equivalent of the analog memory shown in FIG. 8 of my U.S. Pat. No. 3,860,760, if the analog memory were to be arranged in a circle. The moving read and write-heads act like gates distributing and collecting the stored samples in the correct order.

Assume that the compression ratio C is to be 3.5 and that the magnetic disc can store up to five discrete analog samples. Thus, each sample will occupy $360°/5 \times 72°$.

Now, if both the read and the write-head start out at 0° at time zero, the heads will meet again at some angle $\chi$, where the read-head has moved one revolution more than the write-head.

Thus, $$\chi + 360° = C \times \chi$$

or $$\chi = 360°/(C-1)$$
$$= 360°/(3.5-1)$$
$$= 144°$$

Under these circumstances, the rotational speed of the read-head, $S_R$, is given by $$\begin{aligned} S_R &= (\chi + 360°)/(360° \times T) \\ &= (144° + 360°)/(360° \times 0.5) \\ &= 2.8 \text{ rps} \\ &= 168 \text{ rpm} \end{aligned}$$

where $T$ represents the time taken for one revolution of the disc and the rotational speed of the write-head, $S_W$, is given by $$\begin{aligned} S_W &= \chi/360° T \\ &= 144°/(360° \times 0.5) \\ &= 0.8 \text{ rps} \\ &= 48 \text{ rpm} \end{aligned}$$

While the compression ratio may be changed by varying either W1 or W2, or both, it is advantageous to hold W1 constant and to vary only W2, the angular velocity of the write-head. This is so because only changing W2 will not alter the frequency response of the read channel. The length of a recorded analog sample varies as $C/(C-1)$, which is small for large values of C.

If W1 is held stationary it is, thus, possible to rotate shaft 11 by means of motor M2 rather than hold shaft 11 stationary. This will also eliminate the need to use slip-rings for the write and erase-heads. Also, since the magnetic disc is moving in the opposite direction to the read-head, the rotational speed of the read-head may be reduced, thus, reducing the strain on the drive mechanism. To avoid cluttering the drawing, no erase-head is shown in FIG. 1. However, in practice, an erase-head is required and is positioned just before the write-head. Physically, the erase-head may be incorporated within the mounting for the write-head or it may be mounted slightly ahead of the write-head (in the direction of rotation) on the same support disc 21.

Figure 2:
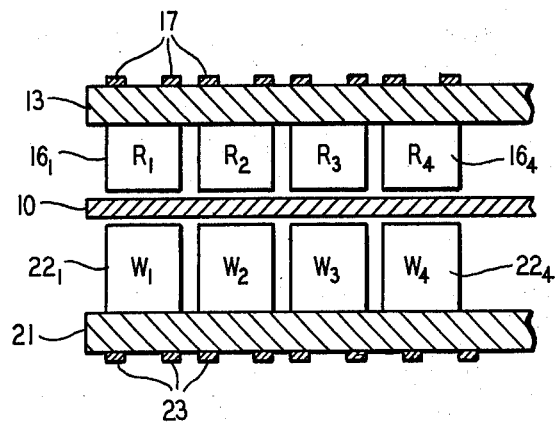
FIG. 2 is a cross-sectional view of part of the apparatus shown in FIG. 1 illustrating the use of multiple record/playback heads.

The above example assumed that only five samples would be simultaneously stored in disc 10. In actual practice, up to 512 samples would be stored. Thus, the speed of the read and write-heads would be considerably increased. If the analog samples were digitized prior to storage, for example, with a four-bit binary code, up to $4 \times 512 = 2048$ positions would be required on the disc which might result in impracticably high read and write-head speeds. In that event, as shown in FIG. 2, disc 13 is modified to support four separate read-heads $16_1-16_4$, each with an associated pair of slip-rings and four separate write-heads $22_1-22_4$, each with an associated pair of slip-rings and the data is stored in four parallel tracks. If the signal levels are such that the contact noise generated by the rotating slip-rings is troublesome, the signals to and from the rotating write and read-heads may be inductively coupled by the use of annular ferrite cup cores, in much the same manner as is done in video-tape recording.

Figure 3:
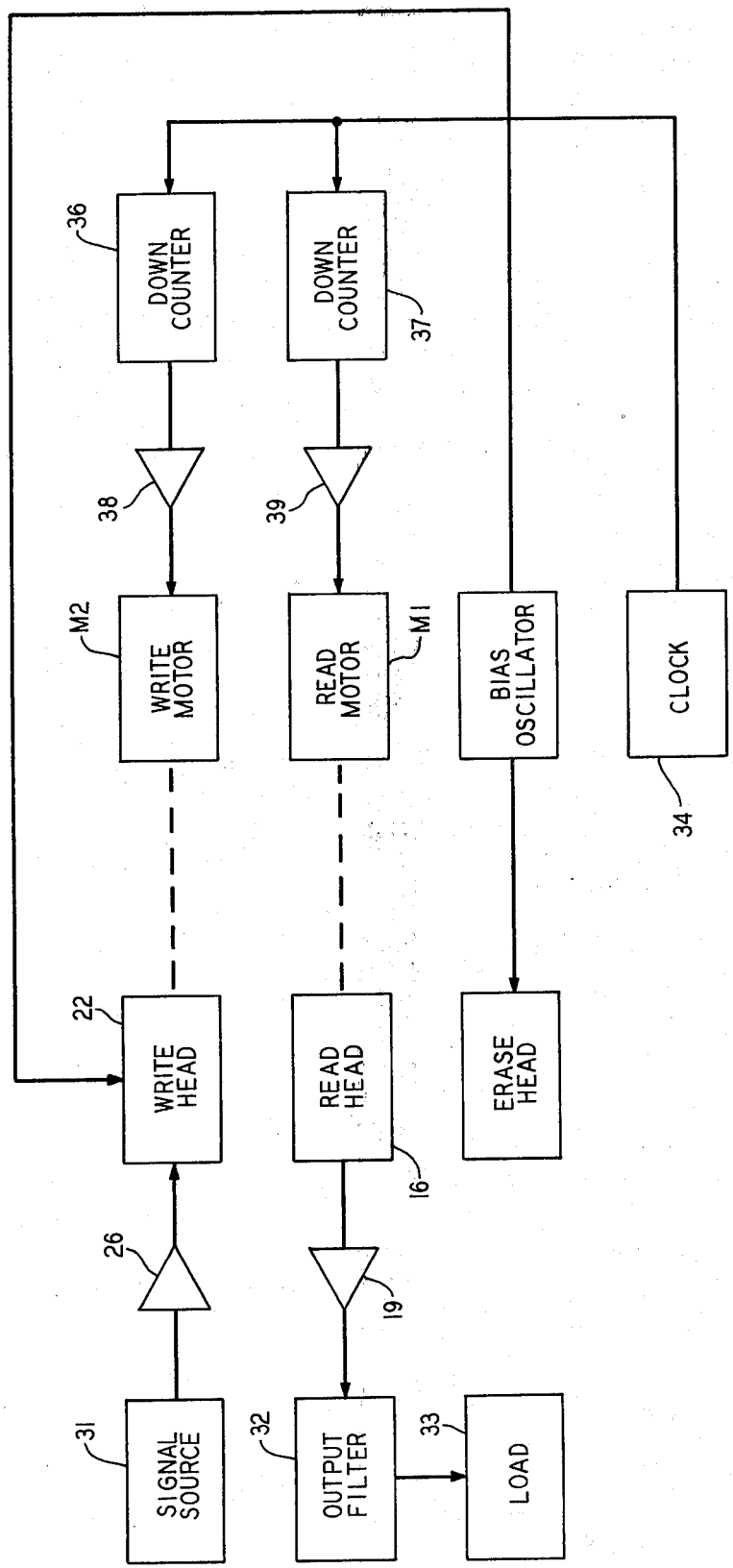
FIG. 3 is a block schematic diagram of the circuitry required to operate the apparatus shown in FIG. 1.

FIG. 3 depicts the circuitry required for operation of the apparatus shown in FIG. 1. As shown, the signal to be compressed or expanded is applied from a signal source 31 to amplifier 26, thence to write-head 22. The output of read-head 16 is applied, via amplifier 19, to an output filter 32, thence to the load 33, which may be an oscilloscope or a loudspeaker.

A clock circuit 34 drives first and second down-counters 36 and 37, respectively. The output of down-counter 36 is amplified in an amplifier 38 and used to drive the synchronous write motor M2. In like fashion, down-counter 37 and amplifier 39 drive read motor M1. Depending upon the division ratios of down counters 36 and 37, read motor M1 will drive the read-head at a faster or slower rate than write motor M2 drives the write-head.

If mechanical gearing is relied on to supply the different read and write drive speeds, clock 34 and down-counters 36 and 37 may be eliminated and motors M1 and M2 driven from a common source, such as the 60 HZ A.C. mains.

We have so far discussed the cases where the write-head and the read-head move at different rates in the same direction about a stationary magnetic disc or, what is functionally the same, where the read-head moves in the opposite direction, about a rotating magnetic disc and the write and erase-heads are stationary.

Figure 4:
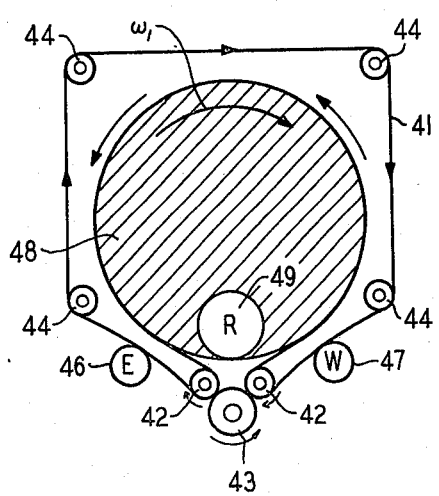
FIG. 4 is a cross-sectional view of an alternate embodiment of the invention using an endless magnetic belt or tape.

FIG. 4 illustrates another embodiment of the invention wherein the magnetic disc is replaced by a continuous magnetic belt 41. Belt 41 is rotated in a clock-wise direction by means of a pair of pressure rollers 42 which engage a drive capstan 43 driven by a motor (not shown). Tape belt 41 is guided by a plurality of guide rollers 44 and engages a stationary write-head 47. Tape belt 41 also traverses the circumferential periphery of a rotating cylinder 48 having an embedded read-head 49 mounted thereon. A second motor, also not shown, drives cylinder 48 in the opposite direction to the direction of belt travel. If the desired compression ratio is C, then cylinder 48 and hence read-head 49 must travel (C-1) times faster than the linear speed at which the tape belt 41 travels.

With reference to the previously used example, cylinder 48 must turn at:

$$S = 1/T$$
$$= 1/0.5$$
$$= 2 \text{ rps}$$
$$= 120 \text{ rpm}$$

Advantageously, the cylinder speed is kept constant and the compression ratio altered by changing the speed at which the tape passes over the circumference of the cylinder.

Note that in the arrangement shown in FIG. 4 there is a slight gap in contact between the tape 41 and the cylinder 48. In other words, the tape-to-cylinder contact is less than 360° of the cylinder's circumference. This means there will be a cyclical gap in the read-out from the tape. This can be avoided by providing two embedded read-out heads positioned 180° apart and switching back and forth between the two heads. In this case, the contact between the tape and the cylinder must be reduced to exactly 180°, which has the added benefit of reducing tape wear.

Figure 6:
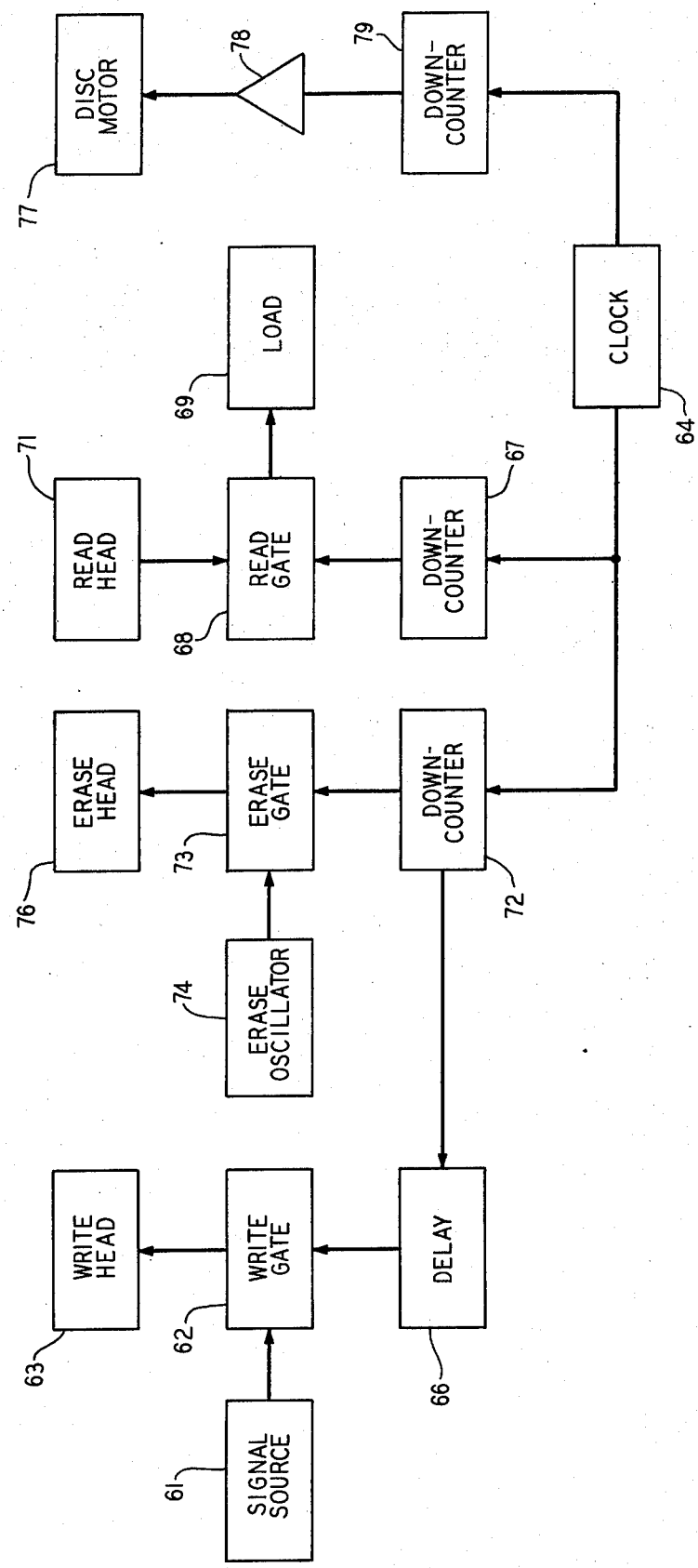
FIG. 6 is a block schematic diagram of the circuitry required to operate the apparatus shown in FIG. 5.

The apparatus shown in FIG. 4 is analogous to the electronic time compressor/expander shown in FIG. 6 of my U.S. Pat. No. 3,860,760. The moving magnetic tape performs the same function as the analog shift register; the fixed write-head acts as the signal source to the shift register; and the moving read-head performs the same function as the plurality of analog gates connected to the several stages of the shift register. Thus, the moving read-head collects the stored analog samples in the desired order for time compression or expansion.

As before, if the analog samples are digitalized, more than one write/erase and read-head are provided to write the data in parallel onto the moving tape which must, of course, have sufficient width to accomodate the four or more parallel data tracks. Alternatively, the data may be stored serially but this will require a large number of storage positions per cylinder revolution.

Figure 5:
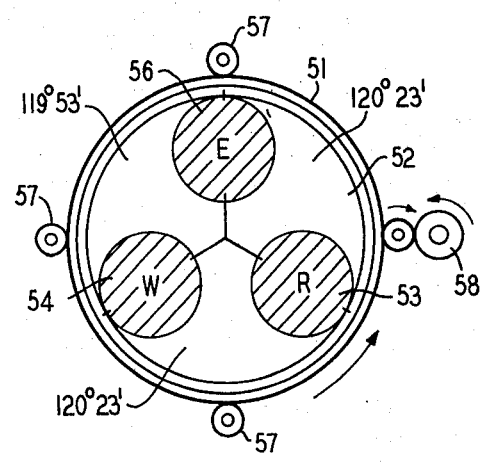
FIG. 5 is a cross-sectional view of yet another illustrative embodiment of the invention which utilizes a rotating magnetic ring or disc.

FIG. 5 depicts yet another embodiment of the invention which is a very fast-shifting memory time compressor for pulse-width modulated samples. As shown in FIG. 5, an annular disc or ring of magnetic material 51 rotates about a fixed disc 52 which has a read-head 53, a write-head 54 and an erase-head 56 embedded therein. The ring 51 is supported by a plurality of rollers 57, one of which engages a frictional drive capstan 58 which, in turn, is driven by a motor (not shown).

Assume first that the same head can be used for both writing and reading and that no erase-head is required. Assume further that at time zero both the write sample ($W_o$) and the read sample ($R_o$) occur together and that disc position $P_o$ is then opposite the single read-write head.

To yield the desired compression ratio, C, between read-out and write-in time, the previous sample must have been stored in position $P_X$. In the simplest case, the previous read sample, $R_{-1}$, must have occurred when the rotation of the disc positioned the single read/write head in the time-slot position just previous to $T_o$, while the previous write sample $W_{-1}$ must have been written exactly one revolution (or M sample positions) earlier.

Using the previous example, and by analogy to the electronic embodiment shown in FIG. 4 of my U.S. Pat. No. 3,860,760, there are 512 storage position around magnetic disc 51. Thus, each position is spaced from its neighbor by $$d = 360°/M$$
$$= 360°/512$$
$$\approx .703°$$

The compression ratio C is given by $$C = (P + M)/P$$

where P is the position around the disc where the previous sample is stored.

Thus $$P = M/(C-1)$$
$$= 512/(3.5-1)$$
$$= 204.8$$

for a compression ratio of $C = 3.5$.

Now, 204.8 is not an integer so $P = 205$ is arbitrarily chosen since 205 is an odd number and has no common factor with $M = 2^9 = 512$. This will result in a compression ratio which is only fractionally smaller than the desired 3.5.

Now, $$M + P = 512 + 205$$

-continued $$= 717$$

Thus, every 717th storage position around the disc the existing sample is replaces with a new one.

In reality, of course, separate heads are required for each erasing, reading and writing operation and, as shown in FIG. 5, these heads are spaced substantially equally about the fixed disc 52. To simplify timing, the heads are not spaced apart exactly at $360°/3 = 120°$ that is at $512/3 \approx 170.67$ positions apart. Actually, they are spaced apart by integral recording positions, one spaced by 170 positions and the other two spaced apart by 171 positions. This corresponds to $360° \times 170/512 \approx 119.53°$ and $360° \times 171/512 \approx 120.23°$. The shorter spacing is advantageously used between the erase-head 56 and the write-head 54 which yields a slightly better magnetic decoupling between the read and write heads.

FIG. 6 depicts the electronic circuitry required with the rotating ring compressor shown in FIG. 5. As shown, the analog signal to be compressed is applied from signal source 61 to write-gate 62 thence to write-head 63. Gate 62 is opened to write a sample onto disc 51 upon receipt of a delayed pulse from a down-counter 72 which divides down the output of clock 64. The required delay is provided by delay circuit 66 which is interposed between down-counter 72 and write-gate 62. The output of clock 64 is also applied to down-counter 67 which periodically opens a read-gate 68 to pass a sample from disc 51 to load 69 by means of the read-head 71. In like fashion, down-counter 72 periodically opens erase-gate 73 to pass current from erase-oscillator 74 to erase-head 76 to erase a previously stored sample, prior to gate 62 being opened to write-in a new sample. Disc motor 77 is driven by amplifier 78 which, in turn, receives the output of down-counter 79 which is driven by clock 64. Now, we have previously assumed that there are $M = 2^9 = 512$ storage positions around the disc and that $P = 205$. Thus:

$$M + P = 512 + 205 = 717$$

Since $T = 0.5$, there must be $$717/0.5 = 1434$$

samples per second read by read-head 71, but because of the $P = 205$ spacing between samples there will actually be $$205 \times 1434 = 293970$$

samples passing by each of the three heads per second.

Advantageously, this number is used as the clock rate of clock 64. The disc motor 77 must drive the magnetic disc by a factor of 1/M times slower.

Thus $$S_m = 293970/512 \approx 574.2 \text{ rps} \approx 34,450 \text{ rpm}$$

This frequency is supplied to motor 77 via down-counter 79 which has a 512:1 counting ratio. Because every 717th position is to be erased, the counting ratio of down-counter 72 must be 717:1; thus erase gate 73 is opened every 717th pulse.

Delay 66, which may comprise for example a 170 stage shift register, delays the same clock pulse that starts the count in down-counter 72 by 170 storage positions. Thus, 170 positions later the write gate 62 is opened to write in a new sample in the position previously erased by erase-head 76.

Down-counter 68 has a counting ratio of 205:1 (since $P = 205$), thus read-head 72 reads every 205th sample, some of which are old samples and some of which are new and freshly written samples. Note the similarity between the operation of the apparatus shown in FIGS. 5 and 6 and the apparatus shown in FIG. 4 of my above-referenced U.S. Pat. No. 3,860,760.

The compression ratio can be changed quite simply by writing the data onto the disc at a slower rate. That is, disc 51 is caused to rotate not one but several revolutions more between each writing operation then between each reading operation.

Since only integral revolution differences are allowed, down-counter 72, which supplies the timing pulse for the erase-head, and via delay 66 for the write-head, is adjusted to count not $(P + M)$ but $(P + mM)$, where $m = 1,2,3 \ldots$.

Since $M = 2^9$, $mM$ when written in binary form has the same nine digits and thus requires little logic to generate.

Under these circumstances, the compression ratio changes from $C$ to $C = (P + mM)$. Thus, if $m = 2$, $C \approx 6$; if $m = 3$, $C \approx 8.5$, etc. Approximately speaking, for each increase in $m$ the compression ratio increases by about 2.5. Because no change is made in the reading speed, the output frequency range stays constant but the length of each storage segment decreases proportionally to the ratio $C/(C-1)$. For large compression ratios this is a very small change and can be ignored. If smaller step changes in the compression ratio are desired, P may be increased or, since P by definition must at all times be smaller than M, the compression ratio may be changed by adding integral multiples of M to the denominator of the compression ratio equation $$C = \frac{P + mM}{P + nM}$$

where
$m = 2,3,4 \ldots$
$n = 1,2,3 \ldots$
$n < m$.

Now, in the arrangement shown in FIG. 5 there is one erase-head, one write-head, and one read-head. However, it is entirely feasible to employ multiple erase-/write and read-heads with sequential switchings being used to connect the appropriate write and read-heads to the input and output channels respectively. For example, if $k$ write-heads (and $k$ erase-heads) are evenly spaced about the magnetic ring, the writing of the $W_{-1}$ sample need only be positioned $512/k$ positions earlier than the reading of the $R_{-1}$ sample. Similar results can be obtained if $l$ read-heads are employed.

The combination of $k$ write-heads and $l$ read-heads yields even greater efficiency. Under these circumstances, the compression ratio is given by the relationship $$C = \frac{P + mM/(k \cdot l)}{P + nM/(k \cdot l)}$$

when $k$ and $l$ are non-negative integers.

Figure 7:
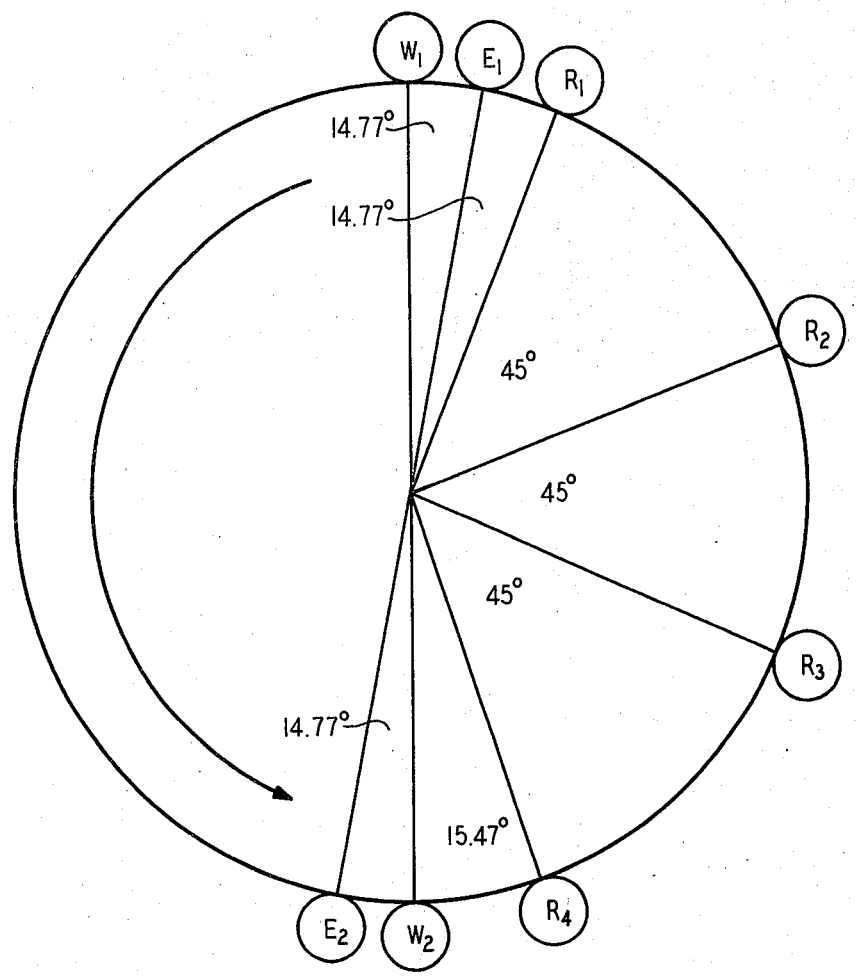
FIG. 7 is a cross-sectional view of still another embodiment of the invention in which multiple write and read-heads are employed with a rotating magnetic ring.

FIG. 7 illustrates the situation where $k = 2$ and $l = 4$ and also illustrates that the write/erase and read-heads can be positioned around the outer periphery of a rotating magnetic disc or ring as well as on the inner periphery. Letting $k = 2$ and $l = 4$ is preferred over $k = 4$ and $l = 2$ since only two erase-heads are needed in the first case but four would be needed in the second. Assume that $m = 1$ and $n = 0$ and that all other parameters remain as in the previous examples. Thus, the compression ratio is given by $$\begin{aligned} C &= (P + M/(k.l))/P \\ P &\simeq M/(k.l(C-1)) \\ &\simeq 512/(2 \times 4 \times (3.5-1)) \\ &\simeq 25.6 \end{aligned}$$

if the desired compression ratio is $C = 3.5$.

As before, P is arbitrarily set to 25, the nearest odd number, so that the compression ratio is actually $C = 3.56$ rather than 3.5.

Under these circumstances, a new sample is written in every $P + M/(k.l) = 89$ positions. The write-heads are spaced apart by $360°/k$ or $180°$ and the read-heads are spaced apart by $360°/(k.l)$ or $45°$.

The distance between the write-heads and the erase-heads must be approximately $360°/(k.l.3)$ or $15°$. This corresponds to $512/(2 \times 4 \times 3)$ or $\simeq 21.3$ data positions. To simplify the timing, the nearest whole number, 21, is chosen which results in an actual spacing of $360° \times 21/512$ or $\approx 14.77°$ rather than $15°$. This is also the distance chosen between the first erase-head and the first read-head leaving $\approx (45° - 2 \times 14.77°)$ or about $15.47°$ for the distance between the second write-head and the fourth read-head.

FIG. 8 depicts the circuitry necessary to operate the arrangement shown in FIG. 7. As shown, the four read-heads $70_1$–$70_4$ are connected, via four analog read-gates $71_1$–$71_4$, to another analog read-gate 72, then to the load 73. The binary input to each of the read-gates 71 is supplied from a corresponding stage of a four-stage, re-entrant shift register 74. The shift input to shift register 74 is connected to the output of a down-counter 76 which divides down the output of a clock 77.

The signal to be processed is applied from signal source 80 to a gate 81 thence to write-gates $82_1$ and $82_2$, the outputs of which are respectively connected to write-heads $83_1$ and $83_2$. The binary input to gate $82_1$ and $82_2$ are respectively connected to the Q and $\overline{Q}$ output of a flip-flop 84. The trigger input to flip-flop 84 is connected to the output of a down-counter 86 which is connected, via an $n$-position delay circuit 87 to the output of a down-counter 88, the input of which is also connected to clock 77.

The output of an erase oscillator 90 is connected to a gate 91 thence to erase-gate $92_1$ and $92_2$ and erase-head $93_1$ and $93_2$. The binary input to gates $92_1$ and $92_2$ are also connected to the Q and $\overline{Q}$ outputs of flip-flop 84 and the binary input to gate 91 is also connected to the output of down-counter 88. However, because of delay circuit 87, gate 91 will gate erase-power from source 90 to the erase-gates $92_1$ and $92_2$ before gate 81 gates the signal from source 80 to write-gates $82_1$ and $82_2$.

The output of down-counter 88 is also connected to one input of a coincidence gate 94, the other input of which is connected to the output of down-counter 76. The output of coincidence gate 94, in turn, is connected to the reset input of down-counter 86 and to the reset input of shift register 74. The output of clock 77 is also connected to a down-counter 96 to drive the disc motor 97.

For the example previously given, $P = 25$, thus clock 77 runs at a frequency $$\begin{aligned} f &= 25 \times 1434 \\ &= 35850 \text{ HZ} \end{aligned}$$

The ratio of counter 96 is, thus, 512:1 so that the disc motor runs at $$\begin{aligned} f_m &= 35850/512 \\ &\approx 70 \text{ rps} \\ &= 4200 \text{ rpm} \end{aligned}$$

It will be observed that the disc motor in the previous example ran at 574.2 rps and the ratio of 574.2/70 is approximately 8.1 that is $\approx k.l$, if $k = 2$ and $l = 4$. In other words, by increasing the number of read-heads to four and the number of write-heads to two, the disc speed has been cut by a factor of approximately eight. The counting ratio for counter 88 is 89:1, for counter 76 it is 25:1 and for counter 86 it is 4:1.

In operation, every 89th clock pulse gate 91 is opened to supply erase power to either erase-head $93_1$ or $93_2$, depending upon the state of flip-flop 84. The delayed output of counter 88 also opens gate 81 to apply an input signal to write-head $83_1$ or $83_2$, again depending upon the condition of flip-flop 84. Every 25th clock pulse, counter 76 opens gate 72 to read a sample from the disc via one of the read-heads $70_1$–$70_4$. Which one of the read-heads supplies the sample, in turn, is determined by binary shift register 74. A binary 1 is fed to the input of shift register 74 by coincidence gate 94, setting all other stages to 0. The 1 is shifted through the register at 1/25 of the clock rate by counter 76. When the binary 1 reaches the last stage of register 74, it is fed back to the beginning again via the re-entrant feedback loop. As the binary 1 progresses through the four stages of the register, it successively enables a corresponding one of the read-gates $71_1$–$71_4$. Thus, the read-heads are connected to the load 73 in the order $71_1$, $71_2$, $71_3$, $71_4$, $71_1$, $71_2$, $71_3$ . . . .

On the other hand, the write-heads are not connected in the sequence $83_1$, $83_2$, $83_1$, $83_2$ but rather $83_1$, $83_1$, $83_1$, $83_1$, $83_2$, $83_2$, $83_2$, $83_2$, $83_1$, $83_1$ . . . .

The reason for this is that although gate 81 opens the write-gates $82_1$ and $82_2$ every 89th clock pulse, the 4:1 down-counter 86 only permits flip-flop 84 to shift state on every fourth pulse from down-counter 87. A similar pattern exists for the erase-heads.

It is, of course, necessary to synchronize the start of the 4:1 down count relative to a certain pulse position in the four-stage binary shift register 74. This is accomplished by coincidence gate 94 which receives on its two inputs both the output of the 25:1 read-head down-counter 76 and the 89:1 output of the write-head down-counter 88. The position of the first read-head $70_1$ is taken as the reference by causing the sync pulse from coincidence gate 94 to force binary shift register 74 to open read-gate $71_1$ while closing all others. Now, the first read-head $70_1$ and the first write-head $83_1$ are 42 positions apart and 58 write-pulses earlier the first write-head $70_1$ wrote the sample now being read (58 × 89 = 5162 and 5162 mod 512 = 42), the 4:1 down-counter 86 must be set to −58 mod4 = 2. This synchronization not only sets the correct initial conditions but also corrects any counting errors which are caused by noise.

As in the previous embodiment, the compression ratio can be changed by writing the data onto the disc at a slower rate but the minimum revolution difference is no longer one revolution (360°) but 360°/(k.l).

Again, if the incoming samples are digitilized, for example, with a 4-bit code, it will be necessary to store the data on four parallel tracks or, after serial conversion, on one track requiring the multiplication of all factors (except the 4:1 down-counter) by 4. Also, in this embodiment of the invention, as in all others previously discussed, the samples may be pulse-width modulated prior to storage using conventional techniques.

One skilled in the art may take various changes and alterations to the arrangement of parts shown, without departing from the spirit and scope of the invention.

What is claimed is:

1. Apparatus for compressing and expanding electronic signals which comprises:
   a stationary cylinder having embedded therein at least one erase-head, at least one write-head, and at least one read-head, said erase-head, write-head and read-head being substantially evenly spaced about the circumference of said cylinder;
   a magnetic ring positioned about said cylinder in engagement with said erase-head, write-head and read-head;
   means for rotating said magnetic ring relative to said cylinder;
   first connecting means for supplying the signal to be processed to said write-head at a first rate;
   first timing means connected to said write-head for determining said first rate at which the signal to be processed is supplied to said write-head;
   second connecting means for supplying the output of said read-head to an external load at a second rate; and
   second timing means connected to said read-head for determining the rate at which the signal to be processed is read off said magnetic ring independent of said ring's rotational velocity.

2. The apparatus according to claim 1 wherein said first timing means comprises:
   a clock circuit having a predetermined clock frequency;
   a first down counter connected to said clock circuit and dividing the output thereof by a factor of $m$; and
   a read gate interposed between said read-head and said first connecting means; said gate being controlled by said first down-counter and connecting the output of said read-head to said load every $m$th count of said clock circuit.

3. The apparatus according to claim 2 wherein said second timing means comprises:
   a second down-counter connected to said clock circuit and dividing the output thereof by a factor of M;
   a write gate interposed between said signal supplying means and said write-head; and
   a delay circuit connected to said second down-counter and delaying the output therefrom by a number of $p$ clock pulses, the output of said delay circuit being connected to said write-gate to connect said supplying means to said write-head every $m$th clock pulse.

4. The apparatus according to claim 3 further including:
   a source of erase current;
   an erase-gate interposed between said source of erase current and said erase-head, said gate being connected to the output of said second down-counter and connecting said source of erase power to said erase-head every $n$th count of said clock circuit, but $p$ clock pulses earlier than said write-gate is opened.

5. The apparatus according to claim 4 wherein said rotating means includes a motor means, said apparatus further comprising:
   a third down-counter connected to said clock circuit and dividing the output thereof by a factor of Q; and
   means, connected to the output of said third down-counter, for driving said motor means at 1/Q times said predetermined clock frequency.

6. Apparatus for compressing and expanding electronic signals which comprises:
   a rotatable disc of magnetic material;
   $k$ magnetic write-heads positioned about said disc to induce localized changes in the magnetic state thereof;
   $l$ magnetic read-heads positioned about said disc to read the localized changes by said $k$ write-heads, where $k \leq l$
   means for rotating said disc past said write and read-heads;
   means for applying the signal to be processed to successive ones of said $k$ write-heads and for controlling a first rate at which the signals to be processed will be written onto said disc; and
   means for connecting successive ones of said read-heads to an external load and for controlling a second rate at which signals will be read off said disc, independent of said disc's rotational velocity, said second rate being faster or slower than said first rate at which the signals are read onto said disc thereby providing for the compression or expansion of said signals.

7. The apparatus according to claim 6 wherein said write-heads are spaced apart by 360°/$k$ and said read-heads are spaced apart by 180°/$l$ and are substantially evenly interposed between said write-heads.

8. The apparatus according to claim 6 further comprising:
   $k$ erase-heads each positioned proximate a corresponding one of said $k$ write-heads to erase a localized change in said magnetic disc prior to the adjacent write-head inducing a new localized change therein;
   a source of erase power; and means for connecting said source of erase power to successive ones of said erase-heads.

9. The apparatus according to claim 8 wherein said connecting and controlling means comprises:
a clock circuit having a predetermined clock frequency;
a first down-counter connected to said clock circuit for dividing the output frequency thereof by a factor of $m$;
an $l$-stage, re-entrant shift register connected to said first down-counter, the count therein being advanced at a rate which is $1/m$ times said clock frequency;
a first gate having: an output connected to said external load, an analog input, and a binary input connected to said first down-counter; and
$l$ analog read-gates each interposed between a corresponding one of said read-heads and the analog input of said first gate, the binary input of each of said read-gates being connected to a corresponding stage of said $l$-stage shift register.

10. The apparatus according to claim 9 wherein said applying and controlling means comprises:
a second down-counter connected to said clock circuit for dividing the output frequency thereof by a factor of $n$;
a third down-counter connected to said second down-counter for dividing the output frequency by a factor of $q$;
a delay circuit interposed between said second and said third down-counters;
a bistable multivibrator having $k$ complimentary outputs connected to and triggered by said third down-counter;
a second analog gate having an analog input connected to the source of the signals to be processed, an analog output, and a binary input connected to the output of said delay circuit;
$k$ analog write-gates each interposed between the analog output of said second analog gate and a corresponding write-head and having a binary input connected to a corresponding one of the complimentary outputs of said bistable multivibrator; and
a coincidence gate having a first input connected to the output of said first down-counter, a second input connected to the output of said second down-counter and an output connected to the reset inputs of said binary counter and said third down-counter.

11. The apparatus according to claim 10 wherein said erase power connecting means comprises:
a third analog gate having an input connected to said source of erase power, a binary input connected to the output of said second down-counter, and an analog output; and
$k$ analog erase-gates each interposed between the analog output of said third gate and a corresponding erase-head and having a binary input connected to a corresponding one of the complimentary outputs of said bistable multivibrator.

* * * * *